US 6,674,064 B1

(12) United States Patent
Chernyak et al.

(10) Patent No.: US 6,674,064 B1
(45) Date of Patent: Jan. 6, 2004

(54) METHOD AND SYSTEM FOR PERFORMANCE IMPROVEMENT OF PHOTODETECTORS AND SOLAR CELLS

(75) Inventors: Leonid Chernyak, Orlando, FL (US); Alfons Schulte, Orlando, FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 10/192,279

(22) Filed: Jul. 10, 2002

Related U.S. Application Data (60) Provisional application No. 60/306,377, filed on Jul. 18, 2001.

(51) Int. Cl.$^7$ ................................................ H01J 40/14
(52) U.S. Cl. ............................... 250/214.1; 250/214 R; 250/356
(58) Field of Search ....................................... 250/214.1

(56) References Cited

U.S. PATENT DOCUMENTS

| | | | |
|---|---|---|---|
| 3,278,814 A | 10/1966 | Rutz | 317/235 |
| 3,864,174 A | 2/1975 | Akiyama et al. | 148/1.5 |
| 3,894,890 A | 7/1975 | Bauerlein et al. | 148/1.5 |
| 3,938,178 A | 2/1976 | Miura et al. | 357/91 |
| 4,065,780 A | 12/1977 | Ballantyne | 357/6 |
| 4,161,814 A | 7/1979 | Ballantyne | 29/580 |
| 4,210,464 A | 7/1980 | Tanaka et al. | 148/1.5 |
| 4,238,694 A | 12/1980 | Kimerling et al. | 307/238 |
| 4,275,404 A | 6/1981 | Cassiday et al. | 357/19 |
| 4,349,906 A | 9/1982 | Scifres et al. | 372/50 |
| 4,399,448 A | 8/1983 | Copeland, III | 357/19 |
| 4,414,558 A | 11/1983 | Nishizawa et al. | 357/17 |
| 4,454,526 A | 6/1984 | Nishizawa et al. | 357/30 |
| 4,585,489 A | 4/1986 | Hiraki et al. | 148/1.5 |
| 4,679,063 A | 7/1987 | White | 357/30 |
| 4,833,507 A | 5/1989 | Shimizu et al. | 357/4 |
| 5,510,274 A | 4/1996 | Minato | 437/6 |
| 5,808,352 A | 9/1998 | Sakamoto | 257/590 |
| 5,858,559 A | 1/1999 | Barbour et al. | 428/690 |

OTHER PUBLICATIONS

S.J. Pearton, J.C. Zolper, R.J. Shul, F. Ren, GaN: Processing, defects, and devices, *J. Appl. Phys.* vol. 86, No. 1, Jul. 1, 1999, pp. 1–78.

S.M. Sze, Semiconductor Devices Physics and Technology (Wiley, New York, 1985), p. 756.

C.H. Qiu, J.I. Pankove, Deep levels and persistent photoconductivity in GaN thin films, *Appl. Phys. Lett.* 70, 1983, Apr. 14, 1997.

(List continued on next page.)

*Primary Examiner*—John R. Lee
*Assistant Examiner*—Erin-Michael Gill
(74) *Attorney, Agent, or Firm*—Brian S. Steinberger; Law Offices of Brian S. Steinberger (57) ABSTRACT

The subject of this invention are method and system for enhancing performance characteristics (quantum efficiency, photoresponse, and spectral range) in photon detectors and solar cells (both of which are referred to as photon devices). The photon detectors are p-n junctions and/or Schottky barrier diodes. The solar cells are p-n junctions. The method and system can include injecting electrons into a p-region of a photon detector or solar cell over a selected time period of up to approximately 1500 seconds to control and improve minority carrier transport, in particular a diffusion length. The injection of electrons can occur periodically over several days and can occur under a o forward bias of the p-n junction or Schottky barrier. Improvements in quantum efficiency can be between approximately 2 to approximately 5 fold. The performance output of the device can be automatically sensed with computer type logic circuits, to actively control in real time the electron injection and to maximize performance results.

27 Claims, 7 Drawing Sheets

OTHER PUBLICATIONS

L. Chernyak, A. Osinsky, V. Fuflyigin, E.F. Schubert, Electron beam–induced increase of electron diffusion length in p–type GaN and AIGaN/GaN superlattices, *Appl. Phys. Lett.*, 77, (2000), pp. 875–877.

L. Chernyak, A. Osinsky, A. Schulte, Minority carrier transport in GaN and related materials, *Solid State Electron 45*,, pp. 1687–1702.

L. Chernyak, G. Nootz, A. Osinsky, Enhancement of minority carrier transport in forward biased GaN p–n junction, *Electron. Lett., vol. 37*, Jul. 5, 2001, pp. 922–923.

L. Chernyak, A. Osinsky, V. Fiflyigin J.W. Graff, E.F. Schubert, Minority Electron Transport Anisotropy in P–Type $Al_xGa_{1-x}N$/GaN Superlattices, *IEEE Trans. Electron. Devices* 48, 433, Mar., 2001, pp. 433–437..

S. Nakamura, M. Senoh, T. Mukai, Highly P–Typed Mg–Doped GaN Films Grown with GaN Buffer Layers, *Jap. J. Appl. Phys.* 30, L1708, Aug. 20, 1991, pp. 1708–1711..

J.I. Pankove, Optical Processes in Semiconductors (Prentice–Hall, Englewood Cliffs, New Jersey, 1971, pp. 111–112.

M.E. Aumer, S.F. LeBoeuf, M. Smith, L.Y. Lin, H.X. Jiang, S.M. Bedair, Abstract of the talk presented at 2000 Electronic Materials Conference, Jun. 21–23, 2000, University of Denver, Denver, CO.

L. Chernyak, A. Osinsky, H. Temkin, J.W. Yang, Q. Chen, M.A. Khan, Electron beam induced current measurements of minority carrier diffusion length in gallium nitride, *Appl. Phys. Lett*, 69, Oct. 21, 1996, pp. 2531–2533.

D.I. Florescu, V.M. Asnin, F.H. Pollak, A.M. Jones, J.C. Ramer, M.J. Schurman, I. Ferguson, Thermal conducitivity of fully and partially coalesced lateral epitaxial overgrown GaN/saphhire (0001) by scanning thermal microscopy, *Appl. Phys. Lett.*, 77, Sep. 4, 2000, pp. 1464–1466.

M. Razeghi, A. Rogalski, Semiconductor ultraviolet detectors, *J. Appl. Phys.* 79, May 15, 1996, pp. 7433–7474.

G. Y. Zu, et al, High speed, low noise ultraviolet photodetectors based on GaN p–i–n and AlGaN (p)–GaN(i)–GaN(n) structures, *Appl. Phys. Lett.* 71, Oct. 13, 1997, pp. 2154–2156.

T. Li, A.L. Beck, C. Collins, R.D. Dupuis, J.C. Campbell, J.C. Carrano, M.J. Schurman, I.A. Ferguson, Improved ultraviolet quantum efficiency using a semitransparent recessed window AlGaN/GaN heterojunction p–i–n photodiode, *Appl. Phys. Lett.* 75, Oct. 18, 1999, pp. 2421–2423.

D.J.H. Lambert, M.M. Wong, U. Chowdhury, C. Collins, T. Li, H.K. Kwon, B.S. Shelton, T.G. Zhu, J.C. Campbell, R.D. Dupuis, Back illuminated AlGaN solar–blind photodetectors, *Appl. Phys. Lett.* 77, Sep. 18, 2000, pp. 1900–1902.

J.M. Van Hove, R. Hickman, J.J. Klaassen, P.P. Chow, P.P. Ruden, Ultraviolet–sensitive, visible blind GaN photodiodes fabricateed by molecular beam epitaxy, *Appl. Phys. Lett.* 70, Apr. 28, 1997, pp. 2282–2284.

L. Chernyak, A. Schulte, A. Osinsky, J. Graff, E.F. Schubert, Influence of electron injection on performance of GaN photodetectors, *Appl. Phys. Lett.* Feb. 11, 2002, pp. 926–928.

E. Muñoz, E. Monroy, J.L. Pau, F. Calle, F. Omnés, P. Gibart, III nitrides and UV detection, *J. Phys.: Condens. Matter* 13, (2001), pp. 7115–7137.

METHOD AND SYSTEM FOR PERFORMANCE IMPROVEMENT OF PHOTODETECTORS AND SOLAR CELLS

This invention relates to photon devices and more specifically to a method and system for improving the performance characteristics using electron injection into the p-region of photovoltaic detectors and solar cells, and this invention claims the benefit of priority to U.S. Provisional Patent Application 60/306,377 filed Jul. 18, 2001.

BACKGROUND OF THE INVENTION

The Sun is the most powerful UV source, and the living species of the Earth's ecosystem are affected by the solar UV radiation. The ozone layer and other atmospheric gases strongly absorb the UV emission from the Sun, and only light with wavelengths longer than 280 nm reaches the Earth's surface. The determination of the effects of the solar UV light on the terrestrial ecosystem and on human beings is an important subject, and has been driving the need for reliable and efficient visible-blind UV detectors.

The high-energy cut-off of UV (Al)GaN-based photovoltaic detectors is generally limited by the large absorption coefficient at high energies and the small minority carrier diffusion length. As a result, high-energy photons are absorbed in the cladding layer rather than in the space-charge region. Several design changes have been recently reported to overcome these limitations including the use of p-i-n instead of p-n junctions, employment of $Al_xGa_{1-x}N$ instead of GaN windows, use of semitransparent recessed windows, and back-illuminated detector configurations. See G. Y. Xu, A. Salvador, W. Kim, Z. Fan, C. Lu, H. Tang, H. Morkoç, G. Smith, M. Estes, B. Goldenberg, W. Yang, S. Krishnankutty, Appl. Phys. Lett. 71, 2154 (1997); T. Li, A. L. Beck, C. Collins, R. D. Dupuis, J. C. Campbell, J. C. Carrano, M. J. Schurman, I. A. Ferguson, Appl. Phys. Lett. 75, 2421 (1999); D. J. H. Lambert, M. M. Wong, U. Chowdhury, C. Collins, T. Li, H. K. Kwon, B. S. Shelton, T. G. Zhu, J. C. Campbell, R. D. Dupuis, Appl. Phys. Lett. 77, 1900 (2000); and J. M. Van Hove, R. Hickman, J. J. Klaassen, P. P. Chow, P. P. Ruden, Appl. Phys. Lett. 70, 2282 (1997).

Despite the considerable broadening of spectral range and the increase in peak responsivity attained due to the new designs (as described in the above listed references), a direct control of fundamental GaN transport properties, such as minority carrier diffusion length, has never been achieved. Minority carrier diffusion length is a distance covered by minority carriers due to diffusion, without recombination.

Current GaN-based device technologies include light-emitting diodes (LEDs), laser diodes, and UV detectors on the photonic side. The potential of the wide band gap, nitride-based, GaN and AlGaN semiconductors for use in optoelectronics has been well documented. See S. J. Pearton, J. C. Zolper, R. J. Shul, F. Ren, J. Appl. Phys. 86, 1 (1999). However, there are remaining problems.

As was already mentioned, the main difficulty that has been encountered for Schottky or p-n junction photovoltaic detectors is the reduced response at high energy, due to the large absorption coefficient and the small diffusion length, L, in GaN. Carriers are, therefore, generated close to the surface and recombine. In order to solve this problem, very thin p layers (for light incident on the p side of a p-n junction) must be used.

For optoelectronic device to be produced in the nitride semiconductors, improvements in p-type doping are needed. At present, Magnesium (Mg) is the only technologically feasible acceptor in (Al)GaN technology. See S. J. Pearton, J. C. Zolper, R. J. Shul, F. Ren, J. Appl. Phys. 86, 1 (1999).

In p-type (Al)GaN, similar to (Al)GaAs, several types of deep levels, located 1.1, 1.4, 2.04 eV above the valence band edge, were identified. See C. H. Qiu, J. I. Pankove, Appl. Phys. Lett. 70, 1983 (1997). These levels are likely related to Mg doping and are assumed to be responsible for the persistent photoconductivity behavior in III-Nitrides. See C. H. Qiu, J. I. Pankove, Appl. Phys. Lett. 70, 1983 (1997).

Various U.S. Patents have been proposed over the years. See for example, U.S. Pat. No. 3,864,174 to Akiyama et al.; U.S. Pat. No. 3,894,890 to Bauerlein et al.; U.S. Pat. No. 3,938,178 to Miura et al.; U.S. Pat. No. 4,065,780 to Ballantyne; U.S. Pat. No. 4,161,814 to Ballantyne; U.S. Pat. No. 4,210,464 to Tanaka et al.; U.S. Pat. No. 4,238,694 to Kimerling et al.; U.S. Pat. No. 4,275,404 to Cassidy et al.; U.S. Pat. No. 4,349,906 to Scifres et al.; U.S. Pat. No. 4,399,448 to Copeland; U.S. Pat. No. 4,414,558 to Nishizawa et al.; U.S. Pat. No. 4,454,526 to Nishizawa et al.; U.S. Pat. No. 4,585,489 to Hiraki et al.; U.S. Pat. No. 4,679,063 to White; U.S. Pat. No. 4,833,507 to Shimizu et al.; U.S. Pat. No. 5,510,274 to Minato; U.S. Pat. No. 5,808,352 to Sakamoto; and U.S. Pat. No. 5,858,559 to Barbour et al. However, none of the above listed patents overcome the problems with the prior art described above.

SUMMARY OF THE INVENTION

The primary objective of the invention is to provide a method and system for enhancing quantum efficiency, response, and spectral range in photon detectors and solar cells.

The secondary objective of the invention is to provide a method and system for controlling minority carrier diffusion length (transport) to improve the performance of optoelectronic devices.

A preferred method and system for enhancing quantum efficiency, response, and spectral range in photon detectors and solar cells is injection of electrons into a p-region of a photon device over a selected time period and controlling minority carrier diffusion length in the photon device to broaden spectral range and increase responsivity of the photon device. The invention can include periodically injecting electrons after several days, where the selected time includes approximately 10 seconds to approximately 1500 seconds. The electrons can be injected under a forward bias of the p-n junction, and can increase quantum efficiency between approximately 2 to approximately 5 fold.

The photon device can include a p-n junction detector. Additionally, the photon device can include a p-n junction solar cell. And still furthermore, the photon device can include a Schottky barrier detector.

The method and system can also automatically sense the performance output of the photon device with a computer type logic circuit, and provide a feedback signal to control the injection of the electrons.

Further objects and advantages of this invention will be apparent from the following detailed description of a presently preferred embodiment which is illustrated schematically in the accompanying drawings.

BRIEF DESCRIPTION OF THE FIGURES

FIG. 1 a shows a magnified and mixed EBIC (Electron Beam Induced Current)(dark vertical contrast) and secondary electron image of a p-n junction, cleaved perpendicular to the growth plane of a GaN/sapphire interface.

DESCRIPTION OF THE PREFERRED EMBODIMENTS

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

In p-i-n and p-n photodetectors, it is either the p-type or the n-type side, which predominantly contributes to the photosignal. Assuming that most light absorption takes place in the p-side, the expression for the quantum efficiency, n, can be presented as equation 1:

$$\eta = (1-R)\left(1 - \frac{e^{-\alpha W}}{1+\alpha L}\right) \quad (1)$$

Here R and α can be the reflection and absorption coefficients, respectively; W can be the intrinsic (depletion) layer width; L can be the minority electron diffusion length in the p-side. It is evident from equation (1), that increasing the minority electron diffusion length can lead to a more efficient device.

It has been discovered that in p-GaN ($Al_xGa_{1-x}N$), electron injection (for up to approximately 1500 sec) due to an external bias increases the minority carrier diffusion length, L (see equation (1)). See for example, L. Chernyak, A. Osinsky, V. Fuflyigin, E. F. Schubert, *Appl. Phys. Lett.* 77, 875 (2000); L. Chernyak, A. Osinsky, A. Schulte, *Solid State Electron.* 45, 1687 (2001); L. Chernyak, G. Nootz, A. Osinsky, *Electron. Lett.* 37, 922 (2001); and L. Chernyak, A. Schulte, A. Osinsky, J. Graff, E. F. Schubert, *Appl. Phys. Lett.* 80, 926 (2002), which are nonessential submatter incorporated by reference.

The controllable changes in the material's transport properties were attributed to charging of Mg-related centers (Mg is a common acceptor used in III-Nitrides) and indicated that a performance improvement for GaN-based solar blind detectors (SBDs) can be achieved by electron injection over a reasonably short time (at most approximately 1500 sec). This is because the increased diffusion length improves the minority carrier collection and eliminates the so-called "optical dead space" where carriers recombine without being collected. See for example, D. J. H. Lambert, M. M. Wong, U. Chowdhury, C. Collins, T. Li, H. K. Kwon, B. S. Shelton, T. G. Zhu, J. C. Campbell, R. D. Dupuis, *Appl. Phys. Lett.* 77, 1900 (2000), which is nonessential subject matter incorporated by reference.

As a result, the quantum efficiency of the detector increases as inferred from equation (1).

A practical significance of electron injection, due to an external forward bias, has been demonstrated for an enhancement of quantum efficiency in GaN p-n junctions and Au/p-(Al)GaN Schottky barriers.

Figure 1A:
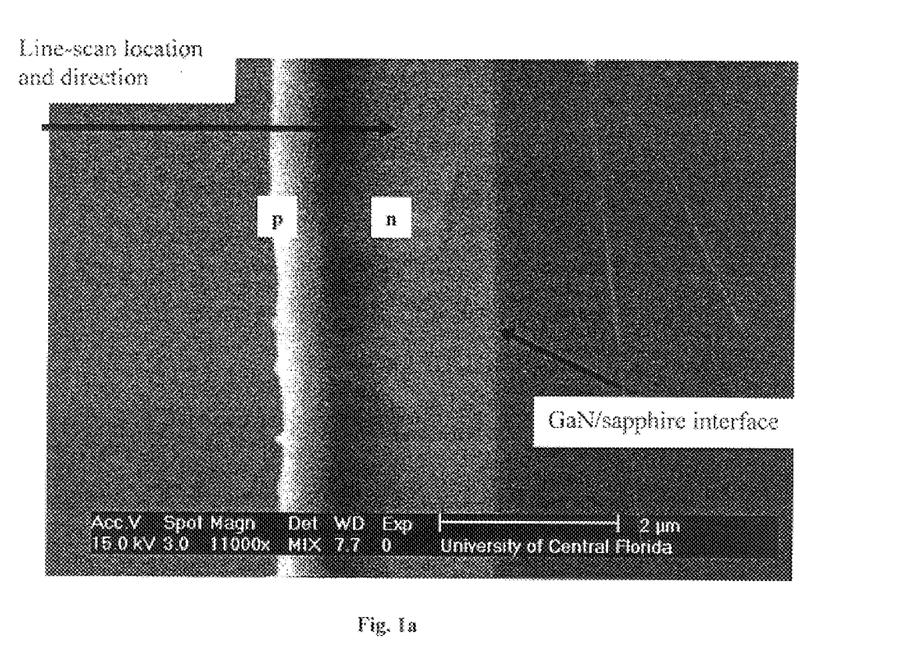

The experiments described here were carried out on a GaN wafers with several p-n junctions fabricated according to the following sequence of epitaxial layers (from top to bottom; see FIGS. 1a, 1b, 1c): approximately 0.6 μm $p^+$-GaN, Mg doped, p=approximately $5\times10^{17}$ $cm^{-3}$; approximately 0.5 μm n-GaN, Si doped, n=approximately $1\times10^{17}$ $cm^{-3}$; approximately 1.3 μm $n^+$-GaN, Si doped, n=approximately $1\times10^{19}$ $cm^{-3}$; sapphire substrate. The p-n junctions were isolated from each other by etching a trench down to n-GaN epi-layer, using chemically assisted ion beam etching (rate of approximately 75 nm/min), thus creating mesa-structures of ~500 and 200 μm in diameter. The n-type contact metalization was Ti/Al/Ni/Au, annealed at approximately 800° C. for approximately 30 seconds. The p-type contact metalization was Ni/Au, annealed at approximately 500° C. for 300 seconds. Resistivities of <(less than) approximately $10^{-5}$ Ohm cm and <(less than) approximately $10^{-3}$ Ohm cm were obtained for n-type and p-type GaN contacts, respectively.

Figure 1B:
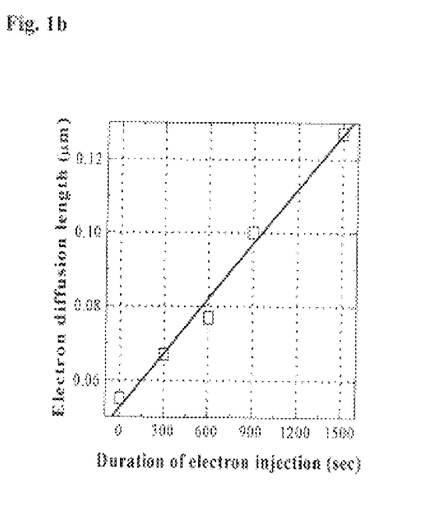
FIG. 1b shows a graph of electron diffusion length versus duration of electron injection which represents the dependence of minority carrier diffusion length on duration of electron injection (from EBIC line-scan).
Figure 1C:
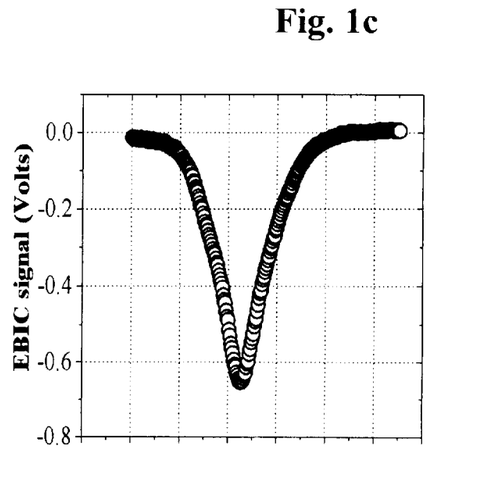
FIG. 1c shows a graph of EBIC signal line-scan across the p-n junction shown in FIG. 1a versus linear coordinate in X-direction, where the x-axis are the linear coordinates in microns (see a scale bar in FIG. 1a).
Figures 2A, 2B:
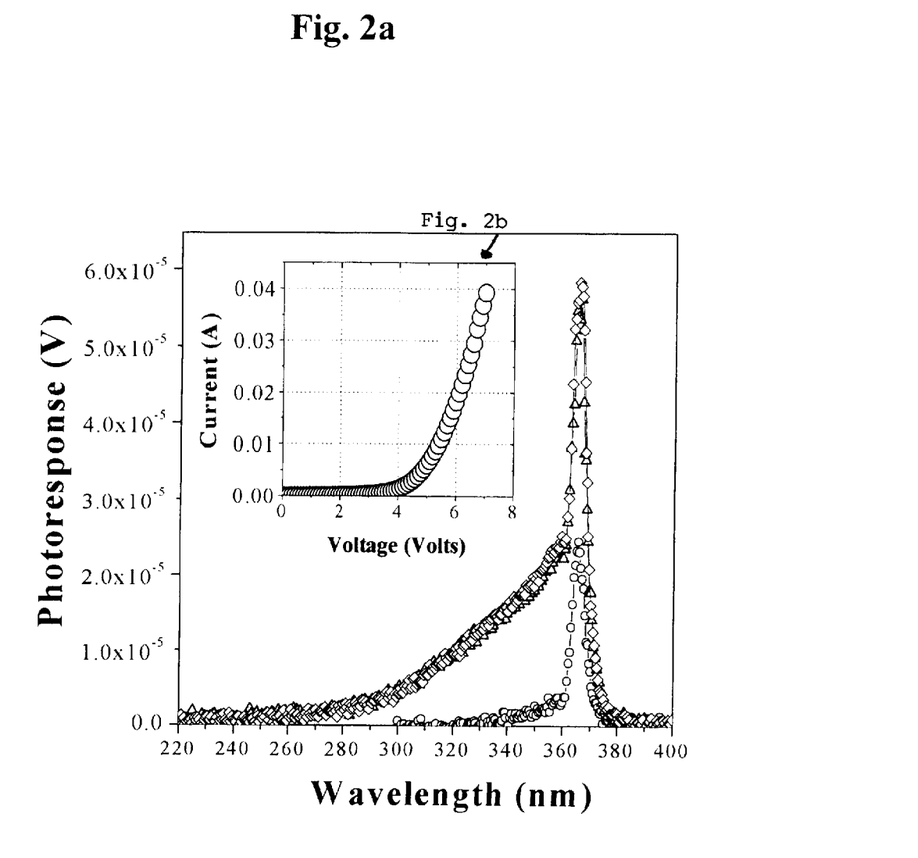
FIG. 2a shows a graph of photoresponse versus wavelength for a p-side illuminated 500 μm-diameter p-n junction detector at zero-bias. Open circles represent the initial photoresponse before electron current injection. Open diamonds and triangles correspond to the situation 40 minutes and 60 hours, respectively, after 80 mA (8 Volts; 20 minutes) electron current injection.
FIG. 2b shows a graph of the p-n junction (FIG. 2a) forward current I-V curve.

Electron injection into the p-region of p-n junction was carried out by forward biasing a p-n junction and passing a current ranging from approximately 25 to approximately 80 mA under an applied voltage from approximately 5 to approximately 8 Volts. A p-n junction forward current I-V curve is presented in the FIG. 2b, and FIG. 1b shows an increase of L as a result of electron injection (approximately 1 A/$cm^2$ current density).

Spectral photoresponse measurements were performed at zero-bias by illuminating the p-side of the p-n junction. A characterization setup comprising a mercury light source and a monochromator was used. The excitation beam was modulated with a mechanical chopper, and the light-induced change in photoresponse as detected using lock-in technique.

To exclude the effects of sample heating on minority carrier transport, the photoresponse measurements were delayed by at least approximately 20 minutes after electron injection. Previously we have demonstrated an increase of L by a factor of approximately 2.5 in the temperature range from approximately 20 to approximately 250° C. See for example, L. Chernyak, A. Osinsky, H. Temkin, J. W. Yang, Q. Chen, M. A. Khan, *Appl. Phys. Lett.* 69, 2531 (1996), which is nonessential subject matter which is incorporated by reference.

Our experiments and estimations indicate that the maximum electric power of approximately 640 mW, dissipated around a forward biased p-n junction, leads to a local temperature increase not higher than approximately 80° C. (approximately 60° C. overheating). This is due to the large thermal conductivity of GaN (up to approximately 2 W/cm K). See for example, D. I. Florescu, V. M. Asnin, F. H. Pollak, A. M. Jones, J. C. Ramer, M. J. Schurman, I. Ferguson, *Appl. Phys. Lett.* 77, 1464 (2000).

FIG. 2*a* shows a spectral response from the p-n junction before and after electron injection. In the particular case presented here the forward current of approximately 80 mA (approximately 8 Volts applied voltage) was flown through an approximate 500 $\mu$m-diameter p-n junction for approximately 20 minutes. While no changes in p-n junction's I-V curves were found after bias, an approximate 250% increase of detector's photoresponse at the GaN band edge and a broader photoresponse spectral range were observed. See for example, L. Chernyak, A. Schulte, A. Osinsky, J. Graff, E. F. Schubert, *Appl. Phys. Lett.* 80, 926 (2002), which is nonessential subject matter which is incorporated by reference.

The effect of electron injection-induced enhancement of the photoresponse persisted for at least approximately 60 hours at the level indicated in FIG. 2*a*.

In a separate experiment the forward current of approximately 40 mA (approximately 7 Volts applied voltage) was flown through an approximately 200 $\mu$m-diameter p-n junction for approximately 5 minutes. The goal of this experiment was to explore the kinetics of photoresponse relaxation to its initial value before electron injection. In contrast to the spectrally resolved measurements, a total photoresponse was measured in this experiment. The results are presented in FIG. 3. The signals are normalized relative to the initial photoresponse before forward current injection. One can see that it takes approximately 60 hours for a signal to exponentially decay by more than a factor of approximately 2 relative to its value immediately after electron injection [8]. See for example, L. Chernyak, A. Schulte, A. Osinsky, J. Graff, E. F. Schubert, *Appl. Phys. Lett.* 80, 926 (2002), which is nonessential subject matter incorporated by reference.

Figure 3:
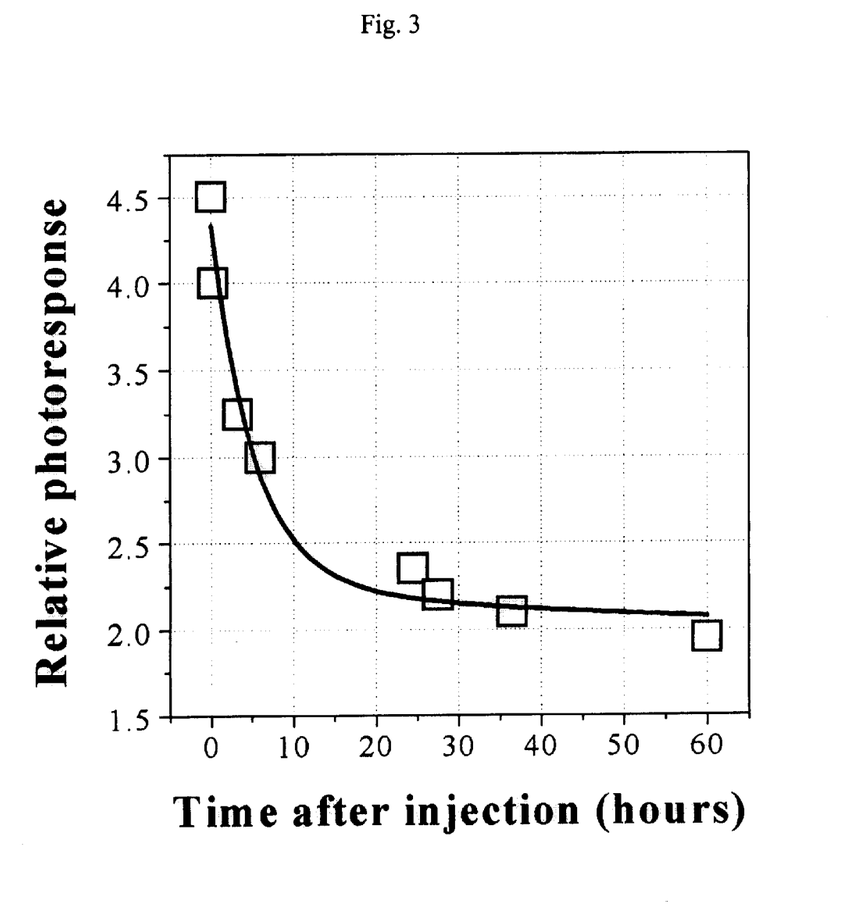
FIG. 3 shows a graph of decay of a relative zero-bias photoresponse versus time after approximately 5 minutes of electron current injection, (approximately 40 mA; approximately 7 Volts) into an approximately 200 μm-diameter p-n junction. The signal is normalized relative to its value immediately after an external bias was switched off.

A photoresponse decay after an electron injection in FIG. 3 is consistent with a decay for the room temperature band-to-band photoluminescence transition intensity in p-GaN after approximately 1500 seconds of electron injection into it. See for example, L. Chernyak, A. Osinsky, A. Schulte, *Solid State Electron.* 45, 1687 (2001), which is nonessential subject matter incorporated by reference.

The difference in dynamics of photoresponse relaxation in FIGS. 2*a*, and 3 is explained by the different current densities for approximately 500 and approximately 200 $\mu$m-diameter p-n junctions.

Overall, the experiments on the photoresponse enhancement were carried out on up to 10 different photodetectors, and the maximum achieved enhancement was around 10, as compared to the situation before external forward bias. Two experiments were carried out on the commercial p-i-n GaN photodetectors manufactured by SVT Associates, Inc., subsidiary of Blue Lotos Microdevices, Inc. We relate the observed effect of p-n junction's photoresponse enhancement to an injection-induced increase of minority electron diffusion length, L, in the p-region of p-n junction due to a charging of the deep Mg-acceptor-related centers [5–8]. See for example, L. Chernyak, A. Osinsky, V. Fuflyigin, E. F. Schubert, *Appl. Phys. Lett.* 77, 875 (2000); L. Chernyak, A. Osinsky, A. Schulte, *Solid State Electron.* 45, 1687 (2001); L. Chernyak, G. Nootz, A. Osinsky, *Electron. Lett.* 37, 922 (2001); and L. Chernyak, A. Schulte, A. Osinsky, J. Graff, E. F. Schubert, *Appl. Phys. Lett.* 80, 926 (2002), which are nonessential subject matter incorporated by reference. This was confirmed by the Electron Beam Induced Current measurements. See for example, L. Chernyak, G. Nootz, A. Osinsky, *Electron. Lett.* 37, 922 (2001), which is nonessential subject matter incorporated by reference.

From the previous experiments we found that L increases up to a factor of approximately 10 due to an electron injection into p-GaN under the above described conditions. From equation (1), using the values of $\alpha=10^5$ cm$^{-1}$ [1], $L_{initial}=10^{-5}$ cm, $L_{final}=10^{-4}$ cm and $W=10^{-5}$ cm, we obtain that the quantum efficiency, $\eta$, increases by a factor of approximately 2. (See for example, L. Chernyak, A. Osinsky, V. Fuflyigin, E. F. Schubert, *Appl. Phys. Lett.* 77, 875 (2000); L. Chemyak, A. Osinsky, A. Schulte, *Solid State Electron.* 45, 1687 (2001); and L. Chemyak, G. Nootz, A. Osinsky, *Electron. Lett.* 37, 922 (2001)), (See for example, L. Chernyak, G. Nootz, A. Osinsky, *Electron. Lett.* 37, 922 (2001), which is nonessential subject matter incorporated by reference). This is in good agreement with the results presented in FIG. 2*a*. It must be noted that detector's spectral range broadens with electron injection. This is very likely related to an improved carrier collection at higher energies (higher absorption). The impact of electron injection on detector's responsivity can be similar to the one achieved due to a decrease of p-layer thickness in the p-i-n photodetector. (See for example, G. Y. Xu, A. Salvador, W. Kim, Z. Fan, C. Lu, H. Tang, H. Morkoçg, G. Smith, M. Estes, B. Goldenberg, W. Yang, S. Krishnankutty, *Appl. Phys. Lett.* 71, 2154 (1997), which is nonessential subject matter incorporated by reference.). This is because both approaches result in suppression of minority carrier recombination in the p-region, by either decreasing the geometrical length or increasing the electron diffusion length.

We note that an approximately 60° C. p-n junction overheating as a result of forward bias application cannot by itself account for the observed effect of photoresponse enhancement due to dissociation of Mg-complexes or temperature-induced increase of L. (See for example, L. Chernyak, A. Osinsky, H. Temkin, J. W. Yang, Q. Chen, M. A. Khan, *Appl. Phys. Lett.* 69, 2531 (1996); and D. I. Florescu, V. M. Asnin, F. H. Pollak, A. M. Jones, J. C. Ramer, M. J. Schurman, I. Ferguson, *Appl. Phys. Lett.* 77, 1464 (2000), which are nonessential subject matter which is incorporated by reference.)

This was verified by heating up the p-n junction up to approximately 80° C. for approximately 1500 sec (with no electron injection) and measuring a zero-bias total photoresponse before and after the temperature was raised. No change in the photoresponse amplitude was observed.

A practical significance of this invention is related to numerous applications of UV photodetectors, from UV astronomy, resin curing of polymeric materials, combustion engineering, water purification, flame detection and biological effects to early missile plume detection, secure space-to-space communications and pollution monitoring.(See for example, E. Muñoz, E. Monroy, J. L. Pau, F. Calle, F. Omnes, P. Gibart, *J. Phys.: Condens. Matter* 13, 7115

Figure 4:
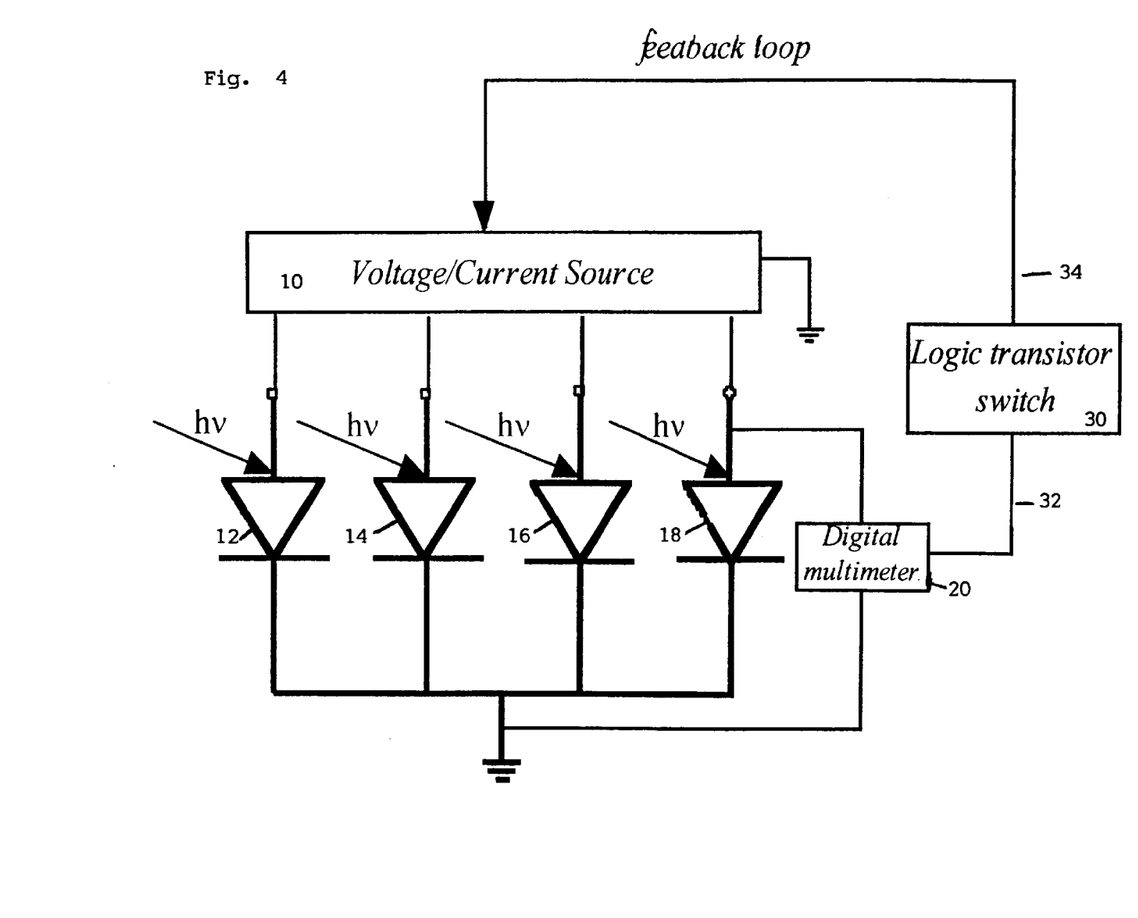
FIG. 4 shows a preferred layout scheme of a photodetector array (bold) and its electrical connection to a power supply and monitoring circuitry for the invention. Inclined arrows represent a quantum of radiation, hv, and thinner lines show the additional elements for monitoring and enhancement of device performance.

(2001), which is nonessential subject matter which is incorporated by reference.) Many of these applications require a use of photodetector arrays. FIG. 4 shows a typical array structure that can use the invention.

To boost a photoresponse, a current/voltage source 10 can be connected to the individual photodetectors 12, 14, 16, 18 of the array as shown in FIG. 4. A short (up to approximately 1500 seconds) forward bias application (approximately 5 to approximately 8 Volts) will increase a photoresponse as shown in FIG. 2a. A combination of digital multimeter 20 (for example, a Keithley 2000) and a logic transistor switch 30 can be used to measure a photosignal 32 and to periodically turn on through a feedback loop 34 a current/voltage source 10 (for example, a standard current/voltage source E3610A by Agilent Technologies, Inc., and the like, can be used), to maintain an enhanced photoresponse signal.

Figure 5:
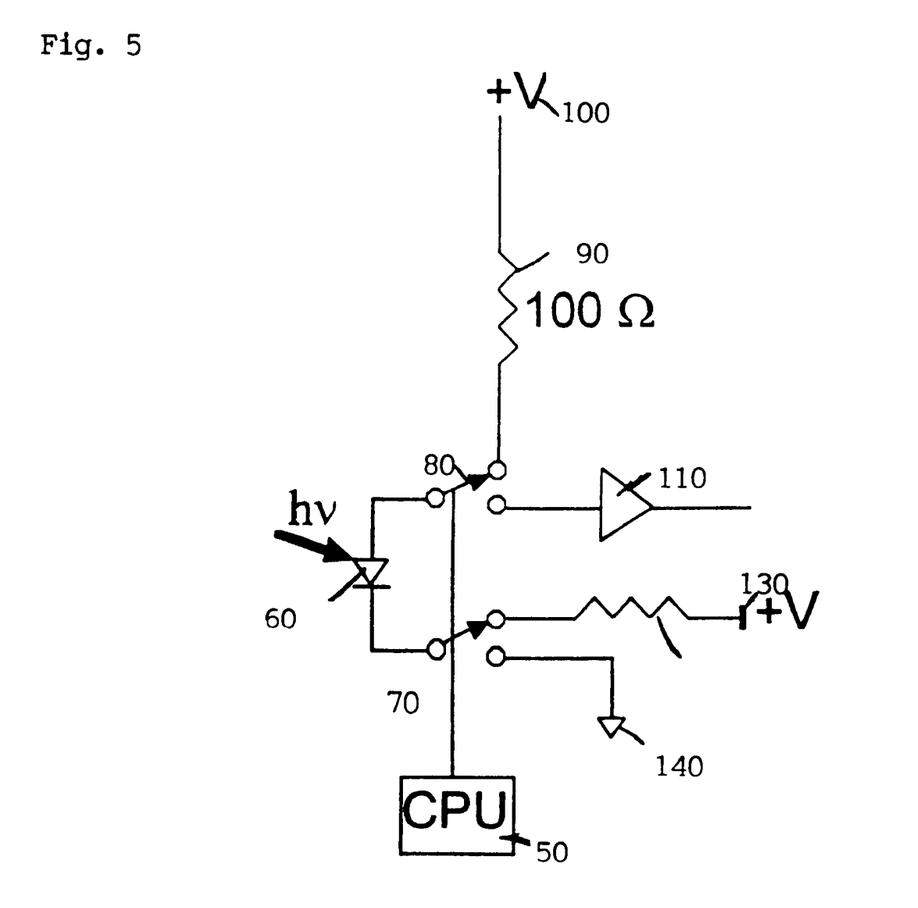
FIG. 5 shows an electrical schematic scheme for photodetector hookup for the invention.

A more detailed electrical scheme is shown in FIG. 5. A central processor unit (CPU) 50, shown in FIG. 5 can be used to periodically apply a short pulse of forward bias. For example, a quantum of radiation, hv, is supplied to photodiode 60 such as a p-i-n photodiode by SVT Associates. The resistor 90 can be a 100 ohm resistor such as RadioShack model 271-1311, the voltage source+V 100 can be a E3610A by Agilent Technologies, hooked up to a photodiode 60 through switches 70, 80, resistors 90, 120, and terminal 130 (as shown). The second resistor shown 120 can be a RadioShack model 271-1311. The operational amplifier 110 can be a RadioShack LM741CN, grounded trough 140 as is shown, and CPU 50 can be a Dell GX100 which is interfaced with a logic switch 70,80 such as CD4007 Transistor Array Package.

In FIG. 5, the logic switch 70,80 is shown in the upper position and the photodetector (diode) 60 is hooked up to the voltage source 100 for forward bias pulsing. Once a pulse is completed, CPU 50 and the switch 70,80 hook up the photodiode 60 to the amplifier 110 for a normal detector operation (lower switch position). Once photodetector's response decays to a preset level, CPU 50 and the logic switch 70,80 hook up the photodetector 60 back to the voltage source 100 (upper switch position) for a new forward bias pulse.

Figure 6:
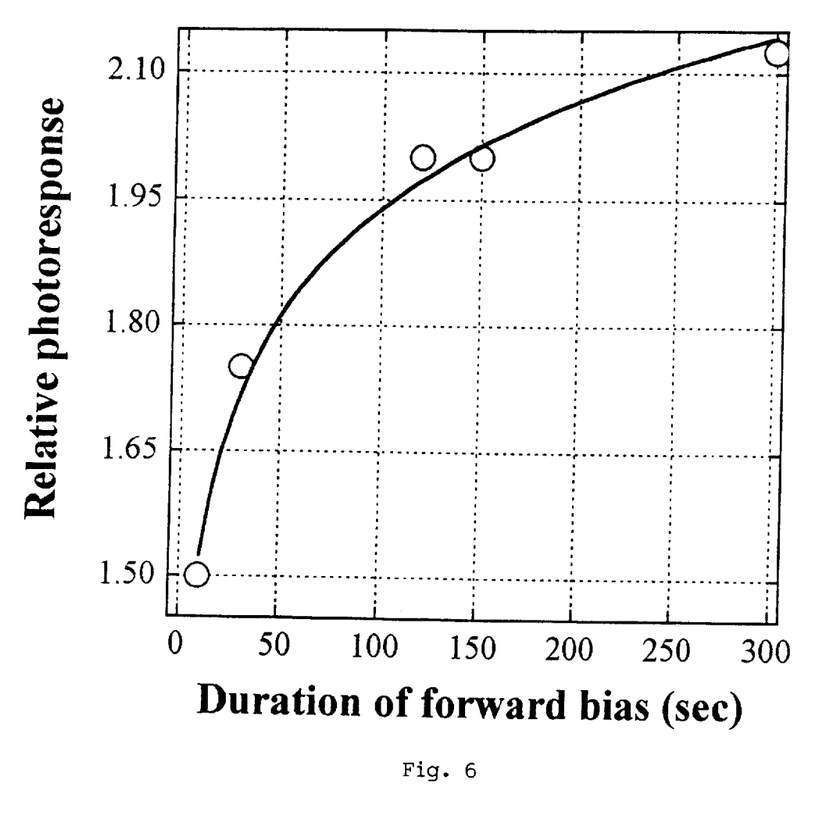
FIG. 6 is a graph of relative photoresponse versus duration of forward bias showing the dependence of relative photoresponse of 500 μm diameter Schottky barrier photovoltaic detector on time of forward bias pulse (approximately 2 mA forward current). Note that a relative photoresponse increase saturates for time of forward bias electron injection exceeding approximately 300 seconds for this particular device structure.

An experimental dependence of photoresponse enhancement on forward bias duration is shown in FIG. 6 for an approximately 500-μm diameter Schottky barrier detector.

Figure 7:
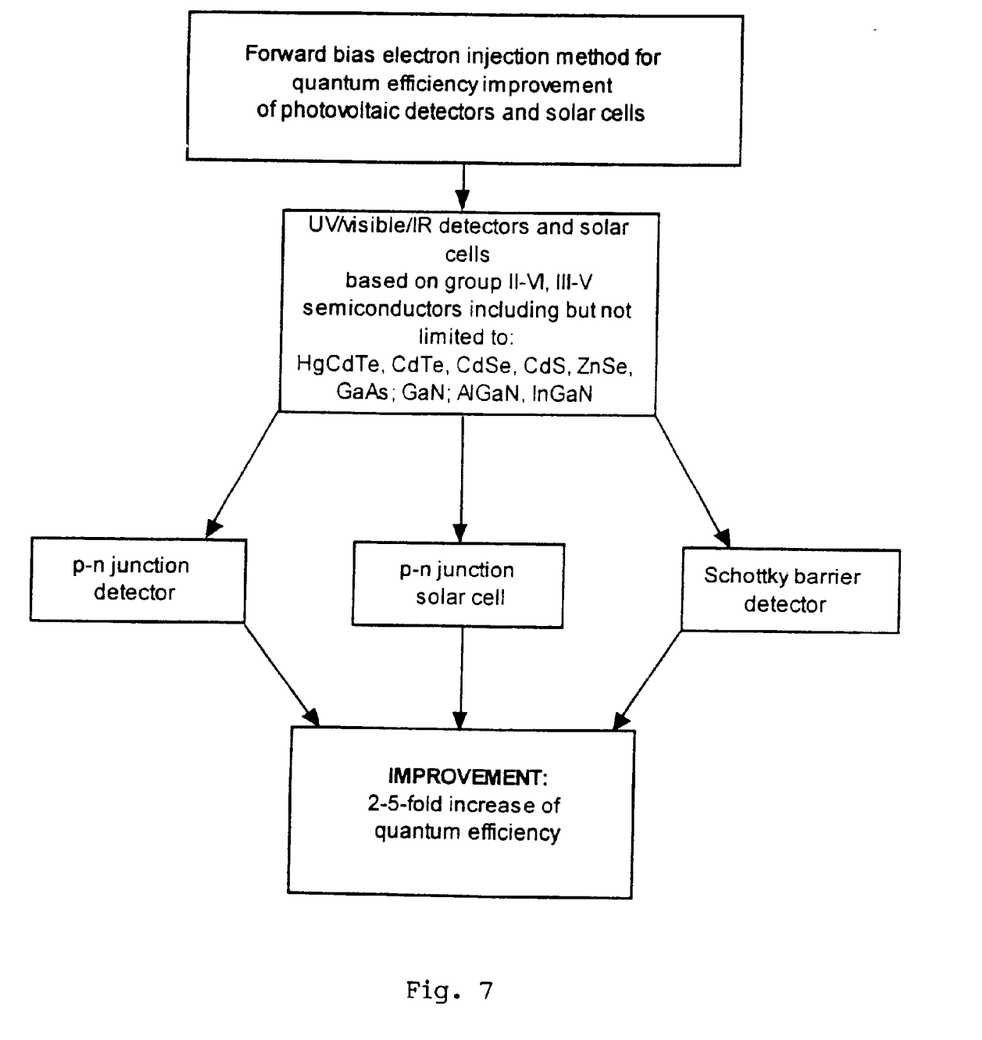
FIG. 7 shows a flowchart scheme of applications for the invention.

It should be noted that the normal photodetector operation requires zero or reverse bias. Short (up to approximately 1500 sec) forward bias (approximately 5 to approximately 8 Volts) application to an AlGaN photodetector, to boost its performance constitutes the invention's applications (FIG. 7). The current/voltage source in FIGS. 4 and 5 can be also used for detector's reverse bias under normal operation conditions, after a short forward bias is completed.

The invention methods and circuitry can be used not only for UV(ultraviolet), but also for visible and IR(infrared) detectors (p-n junction and Schottky barrier diodes) as well as for solar cells (which are essentially p-n junction diodes used under zero bias), based on various II-VI and III-V compounds. This is since the latter compounds contain numerous point defects in the forbidden gap, which may be charged by injecting an electron under bias.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for enhancing quantum efficiency, photoresponse and spectral range in photon devices, comprising the steps of:
   injecting electrons into a p-region of a photon device over a selected time period; and
   controlling minority carrier diffusion length in the p-region of the photon device to broaden its spectral range and increase quantum efficiency and photoresponse.

2. The method of claim 1, further comprising the step of:
   periodically injecting electrons after several days.

3. The method of claim 1, wherein the selected time includes:
   approximately 10 seconds to approximately 1500 seconds.

4. The method of claim 1, wherein the step of injection further includes the step of injecting under a forward bias of one of a p-n junction and a Schottky barrier.

5. The method of claim 1, further comprising the step of:
   increasing quantum efficiency between approximately 2 to approximately 5 fold.

6. The method of claim 1, wherein the photon device includes:
   a p-n junction detector.

7. The method of claim 1, wherein the photon device includes:
   a p-n junction solar cell.

8. The method of claim 1, wherein the photon device includes:
   a Schottky barrier detector.

9. The method of claim 1, wherein the step of controlling includes the steps of:
   sensing performance output of the photon device; and
   providing a feedback signal to control the injecting step.

10. A performance enhancement system for photon device, comprising in combination:
    a photon device having a p-region;
    means for injecting electrons into the p-region of the photon device over a selected time period; and
    means for controlling minority carrier diffusion length in the photon device to broaden spectral range and increase responsivity of the photon device.

11. The system of claim 10, wherein the injecting means includes:
    means for periodically injecting electrons after several days.

12. The system of claim 10, wherein the selected time includes:
    approximately 10 seconds to approximately 1500 seconds.

13. The system of claim 10, wherein the injecting means includes:
    means for injecting under a forward bias of one of a p-n junction and a Schottky barrier.

14. The system of claim 10, further comprising:
    means for increasing quantum efficiency of the photon device between approximately 2 to approximately 5 fold.

15. The system of claim 10, wherein the photon device includes:
    a p-n junction detector.

16. The system of claim 10, wherein the photon device includes:
    a p-n junction solar cell.

17. The system of claim 10, wherein the photon device includes:

a Schottky barrier detector.

18. The system of claim 10, wherein the photon device includes: HgCdTe.

19. The system of claim 10, wherein the photon device includes: CdTe.

20. The system of claim 10, wherein the photon device includes: CdSe.

21. The system of claim 10, wherein the photon device includes: CdS.

22. The system of claim 10, wherein the photon device includes: ZnSe.

23. The system of claim 10, wherein the photon device includes: GaAs.

24. The system of claim 10, wherein the photon device includes: GaN.

25. The system of claim 10, wherein the photon device includes: AlGaN.

26. The system of claim 10, wherein the photon device includes: InGaN.

27. The system of claim 10, further comprising:

means for sensing performance output of the photon device; and means for providing a feedback signal to control the injecting means.

* * * * *